(12) United States Patent
Moriyama et al.

(10) Patent No.: US 7,741,760 B2
(45) Date of Patent: Jun. 22, 2010

(54) DISPLAY APPARATUS

(75) Inventors: Takashi Moriyama, Yokohama (JP); Masahiro Fushimi, Zama (JP); Toshiko Morii, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 493 days.

(21) Appl. No.: 11/384,301

(22) Filed: Mar. 21, 2006

(65) Prior Publication Data
US 2006/0214566 A1 Sep. 28, 2006

(30) Foreign Application Priority Data
Mar. 23, 2005 (JP) .............................. 2005-083601
Mar. 14, 2006 (JP) .............................. 2006-068995

(51) Int. Cl.
*H01J 5/16* (2006.01)
(52) U.S. Cl. ...................................... 313/110; 313/504
(58) Field of Classification Search ......... 313/501–507, 313/110
See application file for complete search history.

(56) References Cited

U.S. PATENT DOCUMENTS

| | | | |
|---|---|---|---|
| 6,456,351 B1 | 9/2002 | Kim et al. ................... | 349/141 |
| 6,834,926 B2 | 12/2004 | Shibata ........................ | 347/15 |
| 2005/0073228 A1* | 4/2005 | Tyan et al. ................... | 313/110 |
| 2005/0280364 A1* | 12/2005 | Omura et al. ................ | 313/506 |
| 2006/0033425 A1 | 2/2006 | Miura et al. ................. | 313/504 |
| 2006/0091380 A1 | 5/2006 | Yuuki et al. .................. | 257/40 |
| 2006/0192220 A1 | 8/2006 | Nishikawa et al. ............ | 257/98 |

FOREIGN PATENT DOCUMENTS

| | | |
|---|---|---|
| JP | 2843924 | 10/1998 |
| JP | 2000-029072 | 1/2000 |
| JP | 2002-029072 | 1/2002 |
| JP | 2006-236947 | 9/2006 |

* cited by examiner

*Primary Examiner*—Nimeshkumar D. Patel
*Assistant Examiner*—Mary Ellen Bowman
(74) *Attorney, Agent, or Firm*—Fitzpatrick, Cella, Harper & Scinto

(57) ABSTRACT

Provided is a display apparatus including a plurality of pixels each composed of an organic electroluminescent device, in which the dependency of a view angle can be reduced without the sacrifice of the luminance of the display apparatus. The display apparatus of the present invention includes a plurality of pixels each composed of an organic electroluminescent device, in which at least one of the pixels is divided into a plurality of areas different in dependency of a view angle.

11 Claims, 6 Drawing Sheets

LIGHT EMISSION

LIGHT EMISSION

DISPLAY APPARATUS

BACKGROUND OF THE INVENTION

1. Field of the Invention

The present invention relates to a display apparatus obtained by arranging a plurality of organic light-emitting devices (organic electroluminescent (EL) devices) on a substrate. In particular, the present invention relates to a display apparatus with improved dependency of a view angle.

2. Related Background Art

In recent years, a display using an organic electroluminescent device (hereinafter referred to as the "organic EL device"), which serves as a display apparatus replacing a liquid-crystal display, has been attracting attention. Applied research for forming the display into a device including the development of a material has been vigorously performed because of various advantages of spontaneously emitting light, requiring no backlight, increasing in the area of the display with ease, providing desired colors by using various materials, driving at a low voltage, and being excellent in high-speed responsiveness.

Further, the display has been recently becoming widespread in the market in the form of a next-generation display such as: the sub-display of a mobile phone; an on-vehicle display; or the display of a digital camera.

An organic EL device is a carrier injection-type flat light-emitting device utilizing light emission occurring upon recombination of an electron and a hole that have reached a light emission layer. FIG. 8 is a schematic diagram showing the general constitution of an organic EL device. The organic EL device shown in FIG. 8 is constituted by: forming a transparent electrode 13 to serve as an anode on a transparent substrate 14; stacking an organic compound layer 12 including a light emission layer on the transparent electrode 13; and stacking a metal electrode 11 to serve as a cathode on the organic compound layer 12. The organic compound layer 12 may appropriately include an electron transport layer, a hole transport layer, or the like other than the light emission layer, depending on a purpose. In general, the organic compound layer 12 is a thin film having a thickness of about 100 nm. In FIG. 8, light generated in the light emission layer of the organic compound layer 12 is taken from the side of the substrate 14 through the transparent electrode 13.

In addition, FIG. 9 is a schematic diagram showing another general constitution of an organic EL device. The organic EL device shown in FIG. 9 is constituted by: forming a reflection electrode 23 on a substrate 24; forming an organic compound layer 22 including a light emission layer on the reflection electrode 23; and forming a transparent electrode 21 on the organic compound layer 22. Light generated in the light emission layer is taken to a side opposite to the substrate 24 through the transparent electrode 21.

As described above, an organic EL device is a spontaneous light-emitting device, is composed of a thin film having a thickness of about 100 nm, and has a reflection electrode. As a result, a so-called interference phenomenon in which light beams generated in the device strengthen or weaken each other occurs. Therefore, it is known that luminance and an emission spectrum vary depending on a view angle.

Such dependency of the view angle becomes a problem of reducing display quality, in view of application to a display apparatus. Japanese Patent No. 2843924 discloses a technique for solving such problem. According to Japanese Patent No. 2843924, an interference condition is set to a condition of weakening light beams mutually at the view angle 0° so that the dependency of luminance on the view angle is reduced.

However, the technique disclosed in Japanese Patent No. 2843924 has a problem that the luminance itself of the display apparatus is sacrificed although the technique exerts a certain effect of improving the dependency of the view angle.

SUMMARY OF THE INVENTION

The present invention has been made in view of the above problems, and an object of the present invention is to provide a display apparatus including a plurality of pixels each composed of an organic electroluminescent device, whereby the display apparatus can reduce the dependency of a view angle without sacrificing luminance.

In order to achieve the above-mentioned object, the present invention provides a display apparatus including a plurality of pixels each composed of an organic electroluminescent device, wherein at least one of the pixels is divided into a plurality of areas different in dependency of a view angle.

Further, the present invention provides a display apparatus including a plurality of pixels each composed of an organic electroluminescent device, wherein the plurality of pixels different in dependency of a view angle are provided for at least one kind of luminescent color.

According to the display apparatus of the present invention which includes a plurality of pixels each composed of an organic electroluminescent device, the dependency of a view angle can be reduced without the sacrifice of the luminance of the display apparatus.

DESCRIPTION OF THE PREFERRED EMBODIMENTS

Figure 1:
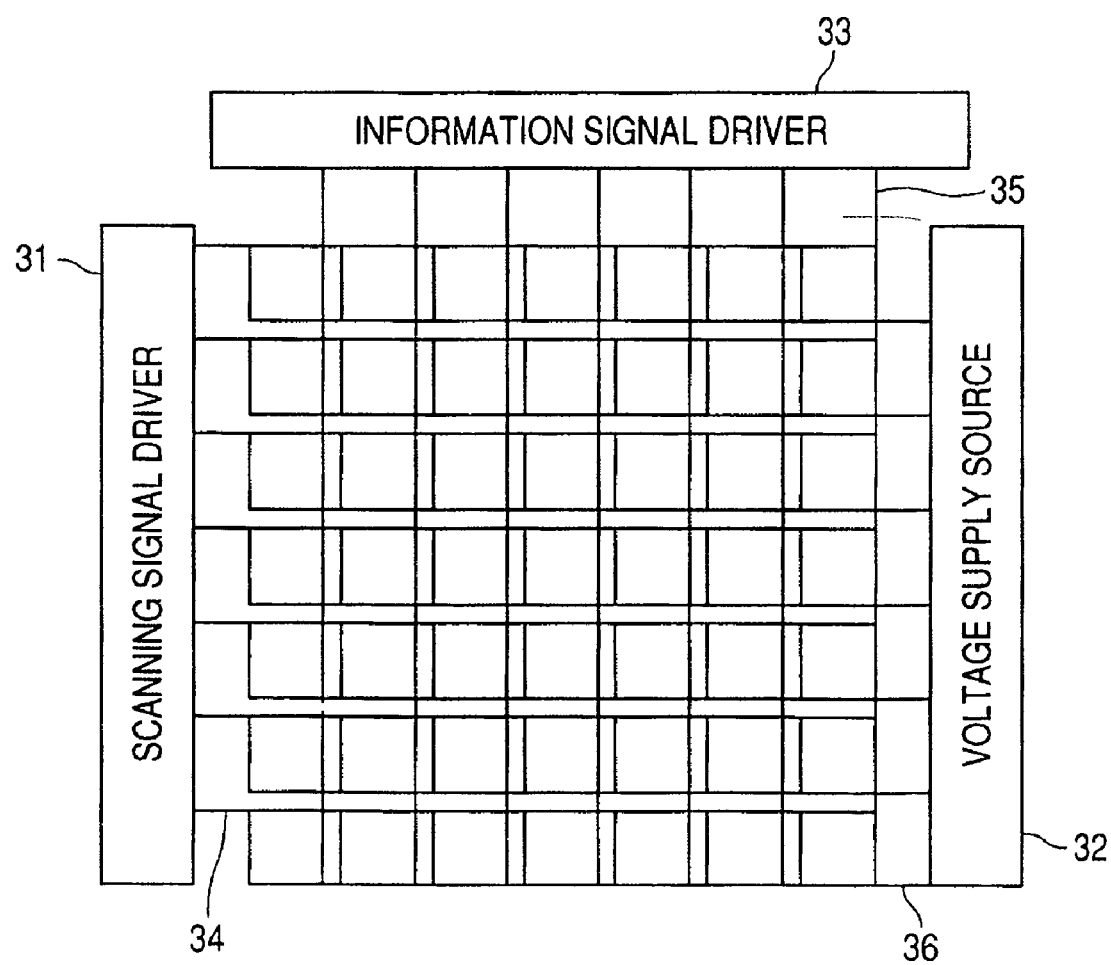
FIG. 1 is a plan view schematically showing a display apparatus of the present invention.

Hereinafter, the best embodiment for carrying out the present invention will be described in detail. However, the present invention is not limited to this embodiment.

In order to display a letter or a picture by means of an organic EL device, such devices must be arranged in a matrix shape to provide a display apparatus. The systems for arranging organic EL devices in a matrix shape are generally classified into a so-called XY simple matrix-type system in which duty driving is performed in a time-division manner and an active driving system in which an active device such as a thin film transistor (TFT) is arranged for each pixel. The simple matrix system is disadvantageous in terms of durability because a large current must be caused to pass through a device so as to obtain a sufficient luminance. At present, the active driving system has been considered to be the nearest thing to be put into practical use. Although the present invention is not limited to the active driving system, the specific constitution of the present invention will be described here as a mode in which a pixel electrode, an organic compound layer, and a counter electrode are formed on a substrate equipped with an active driver circuit and light is taken to a side opposite to the substrate.

The display apparatus of the present invention may be a display apparatus including a plurality of pixels each composed of an organic electroluminescent device, in which at least one of the pixels is divided into a plurality of areas different in dependency of a view angle. The display apparatus has a plurality of pixel units arranged in a matrix shape, and each pixel unit is constituted by a plurality of pixels different in luminescent color such as a red light-emitting pixel, a green light-emitting pixel, and a blue light-emitting pixel. In addition, at least one pixel emitting one color light is divided into the plurality of areas different in dependency of the view angle.

The display apparatus of this embodiment is preferably divided into an area (area α) and another area (area β). In the area α, luminance on a front face is high, and luminance reduces with increasing a view angle. In the area β, luminance on a front face is slightly low, but luminance increases with increasing a view angle. As a result, the dependency of luminance on a view angle can be reduced while luminance on a front face is secured. To be specific, the luminance on the front face is preferably 80% or more of that of a constitution having only an area in which luminance on a front face is high (area α). In addition, the plurality of areas to be divided may be arranged so as to be apart from each other by means of a member such as a device isolation film, or may be arranged so as to be adjacent to each other instead of being apart from each other.

In this embodiment, all pixels may be divided into the plurality of areas different in dependency of the view angle. Alternatively, not all pixels may be divided. In other words, a constitution having both an undivided pixel and a divided pixel is also permitted. In this case, the dependency of the view angle can be adjusted by adjusting a ratio between such pixels.

In the case where both undivided pixels and divided pixels are present, the undivided pixels and the divided pixels may be regularly arranged. Alternatively, the divided pixels may be interspersed irregularly.

In this embodiment, the dependency of the view angle can be adjusted also by adjusting a ratio between the light-emitting area of the area α and the light-emitting area of the area β.

The term "pixel" as used herein refers to the minimum unit that can independently control light emission. In addition, the term "pixel unit" refers to the minimum unit that is constituted by a plurality of pixels different in luminescent color and can emit light having a desired color through the color mixing of the respective pixels.

The display apparatus of the present invention may be a display apparatus including a plurality of pixels each composed of an organic electroluminescent device, in which the plurality of pixels different in dependency of a view angle are provided for at least one kind of luminescent color. The display apparatus has a plurality of pixel units arranged in a matrix shape, and each pixel unit is constituted by a plurality of pixels different in luminescent color such as a red light-emitting pixel, a green light-emitting pixel, and a blue light-emitting pixel. In addition, a plurality of pixels different in dependency of the view angle are provided for at least one kind of the luminescent colors.

In other words, in the display apparatus of this embodiment, the driving of each of pixels different in dependency of the view angle can be controlled independently.

A pixel (pixel δ) and another pixel (pixel γ) are preferably provided for at least one kind of luminescent color out of the pixels constituting the display apparatus of this embodiment. In the pixel δ, luminance on a front face is high, and luminance reduces with increasing the view angle. In the pixel γ, luminance on a front face is slightly low, but luminance increases with increasing the view angle. As a result, the dependency of luminance on the view angle can be reduced while luminance on a front face is secured. To be specific, the luminance on the front face is preferably 80% or more of that of a constitution having only a pixel in which luminance on a front face is high (pixel δ). In addition, the pixel δ and the pixel γ may be arranged so as to be apart from each other by means of a member such as a device isolation film, or may be arranged so as to be adjacent to each other instead of being apart from each other.

In this embodiment, the dependency of the view angle can be adjusted by adjusting a ratio between the number of pixels δ to be arranged and the number of pixels γ to be arranged. The dependency of the view angle can be adjusted also by adjusting the driving current of each of the pixel δ and the pixel γ.

The pixels δ and the pixels γ may be regularly arranged. Alternatively, the pixels γ may be interspersed irregularly in the pixels δ, or vice versa.

In this embodiment, the dependency of the view angle can be adjusted also by adjusting a ratio between the light-emitting area of the pixel δ and the light-emitting area of the pixel γ.

The case where each area or each pixel has two or more kinds of dependency of a view angle is roughly classified into the following two modes.

At first, when an organic EL device is constituted by a first electrode formed on a substrate, an organic compound layer formed on the first electrode, and a second electrode formed on the organic compound layer, the thickness of at least one of the first electrode and the second electrode is changed, whereby two or more kinds of device modes different in dependency of luminance on a view angle can be constituted. Hereinafter, description will be given of a mode in which the thickness of an electrode on the side from which light is taken is changed to provide two or more kinds of dependency of a view angle.

A reflection pixel electrode is formed on a substrate equipped with an active device, and the whole is subjected to patterning. A photoresist method is preferably used for the patterning. The pixel electrode can be selected in consideration of a work function and a reflectance depending on charge to be injected. Cr or the like is preferably used when a hole is injected from the pixel electrode. A vacuum deposition method, an ink-jet method, a printing method, or the like can be used for forming an organic compound layer. Of those, the vacuum deposition method is preferably used in terms of controllability of a thickness. ITO or IZO serving as a transparent conductive film is preferably formed into a counter electrode by means of a sputtering method. An electron injection layer may be used when an electron is injected from ITO.

In one embodiment, pixels different in dependency of a view angle can be prepared by adjusting the thickness of ITO serving as an electrode on the side from which light is taken on condition that the thickness of an organic compound layer is set to a constant value in the constitution of Cr (reflectionanode)/a hole transport layer/a light emission layer/an electron transport layer/an electron injection layer/ITO (transparentcathode). For example, the pixel δ in which luminance at a view angle of 0°, that is, on a front face is high and luminance reduces with increasing view angle, and the pixel γ in which luminance at a view angle of 0° is slightly low but luminance increases with increasing view angle can be prepared. Appropriately arranging the two kinds of pixels in the surface of a display apparatus allows an embodiment in which the dependency of luminance on a view angle is reduced while luminance at a view angle of 0° (on a front face) is secured. In addition, adjusting a mixing ratio between both the pixels can adjust and optimize the dependency of the display apparatus on a view angle.

In this embodiment, when the anodes of all devices are formed so as to have the same thickness, the cathodes as pixel electrodes have a plurality of thicknesses for at least one color light-emitting pixel.

The pixel δ and the pixel γ described above can be made different from each other in dependency of a view angle by setting a thickness in the same manner even when each of the pixels is a single pixel divided into the area α and the area β different from each other in dependency of the view angle.

The following description relates to the case where, when an organic EL device is constituted by a first electrode formed on a substrate, an organic compound layer formed on the first electrode, and a second electrode formed on the organic compound layer, the thickness of at least one layer in the organic compound layer is changed, whereby two or more kinds of device modes different from each other in dependency of luminance on a view angle are constituted.

In one embodiment, dependency of a view angle can be changed by appropriately setting the thickness of an organic EL layer to be constituted on condition that the thickness of ITO serving as an electrode on the side of emitting light is fixed in the constitution of Cr (reflectionanode)/a hole transport layer/a light emission layer/an electron transport layer/an electron injection layer/ITO (transparentcathode). For example, an interference effect in the device can be largely changed by changing the thickness of the hole transport layer between the reflection electrode (anode) and the light emission layer. In other words, the area α in which luminance at a view angle of 0°, that is, on a front face is high and luminance reduces with increasing the view angle, and the area β in which luminance at a view angle of 0° is slightly low but luminance increases with increasing the view angle can be prepared. Appropriately arranging pixels divided into the two areas in the surface of a display apparatus allows an embodiment in which the dependency of a view angle is reduced while luminance on a front face is secured. In addition, adjusting a mixing ratio between a pixel divided into the two areas and a pixel not divided into the areas can adjust and optimize the dependency of the display apparatus on a view angle.

When the organic EL device is an organic EL device having an organic compound layer sandwiched between a reflection electrode and a light transmission electrode, an optical distance from an interface between the organic compound layer and the reflection electrode to an interface between the organic compound layer and the light transmission electrode equal to three quarters to five quarters of a luminescent color peak λ is effective in reducing the dependency of a view angle while securing luminance by means of an interference effect between the electrodes. The optical distance in this case is represented as the product of the actual distance of a medium and the refractive index of the medium.

The area α and the area β described above can be made different from each other in dependency of a view angle by setting a thickness in the same manner even when they are two pixels, the pixel δ and the pixel γ, which can be driven independent of each other.

The above embodiment is one embodiment of the present invention. In the display apparatus of the present invention, in the case of arranging two or more kinds of pixels different in dependency of luminance on a view angle as pixels on a substrate, the positional relationship between the pixels is appropriately adjusted in such a manner that moire or unevenness occurring depending on a method of arranging the pixels can be avoided.

In the above embodiment, description has been given of the constitution in which ITO serving as a transparent electrode is used as an electrode on the side from which light is taken. Alternatively, the electrode on the side from which light is taken may be a semi-transparent electrode. The semi-transparent electrode is, for example, a metal film made of Ag, Pt, Al, or the like, and has a thickness of about 1 nm to 20 nm. A constitution using such semi-transparent electrode can provide increased luminance by means of an interference effect although the constitution strengthens the directivity of light toward a forward direction.

In the above embodiment, description has been given of a so-called top emission-type device in which light is taken from the side opposite to a substrate. The present invention is applicable also to a bottom emission-type device in which light is taken from the side of a substrate. Furthermore, an electrode to be arranged on the side of a substrate may be ancathode, and an electrode on the side opposite to the substrate may be an anode.

The display apparatus of the present invention is preferably applicable to a large-screen display requested to have a wide view angle such as a display having a screen size of exceeding 20 inches.

Hereinafter, the preferred examples of the present invention will be described in detail with reference to the drawings. However, the present invention is not limited to these examples.

At first, description will be given of a driving system in an active matrix-system display apparatus of the present invention which is common to the following respective examples, and a substrate equipped with an active device.

FIG. 1 is a plan view schematically showing the display apparatus of the present invention. As shown in the figure, a driver circuit composed of a scanning signal driver 31 and a current supply source 32, and display signal inputting means as an information signal driver 33 (they are referred to as "image information supplying means") are arranged around a panel, and each of them is connected to X-direction scanning lines 34 called gate lines, Y-direction wires 35 called information lines, and current supply lines 36. The scanning signal driver 31 sequentially selects the gate lines 34, and an image signal is applied from the information signal driver 33 in synchronization with the selection. A pixel for display is arranged at the intersection of each gate line 34 and each information line 35.

Figure 2:
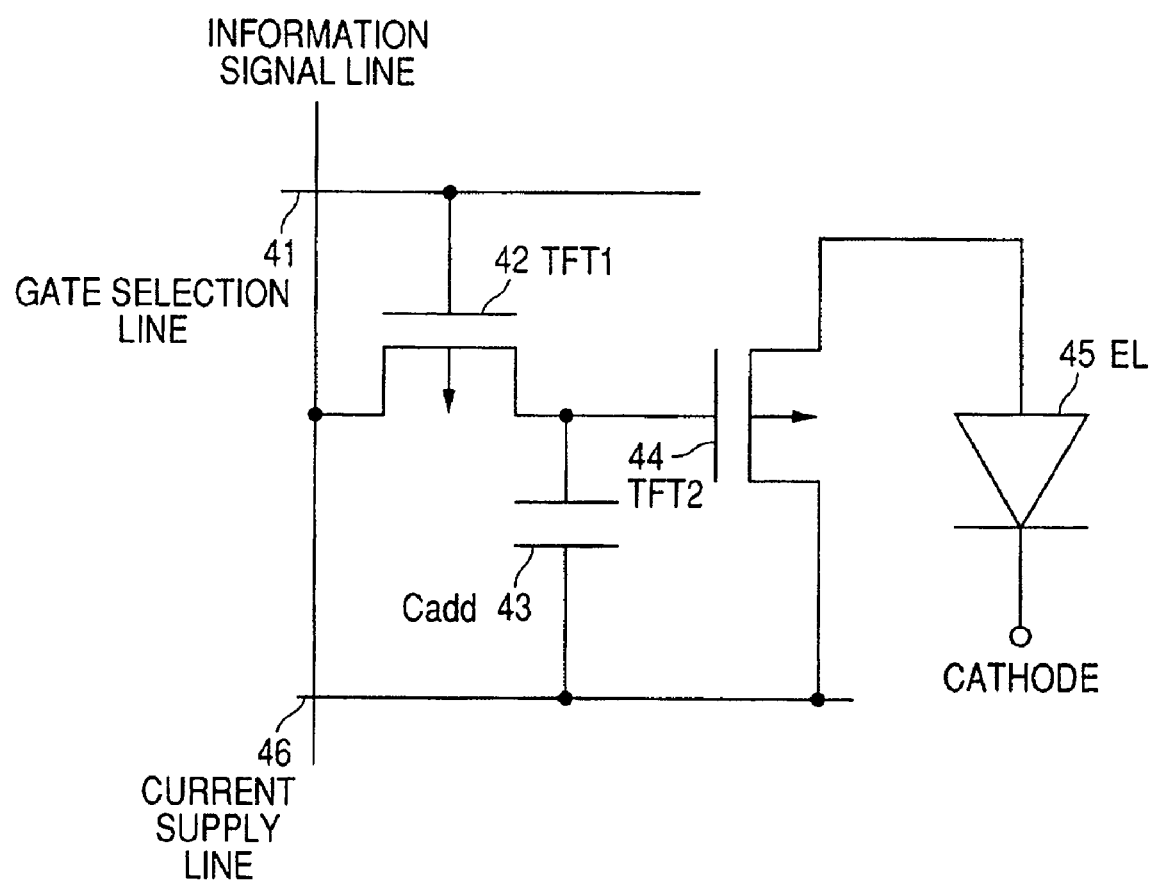
FIG. 2 is an explanatory diagram showing the equivalent circuit of the display apparatus of FIG. 1.

Next, the driving and operation of a pixel circuit will be described with reference to an equivalent circuit shown in FIG. 2. When a selection signal is applied to a gate selection line 41, a TFT1: 42 is turned on. Thus, a display signal is supplied from an information signal line to a capacitor (Cadd) 43, so that the gate potential of a TFT2: 44 is determined. A current supply line 46 supplies a current to an organic light-emitting device portion (hereinafter abbreviated as the "EL device portion") 45 arranged on each pixel in accordance with the gate potential of the TFT2: 44. Since the gate potential of the TFT2: 44 is stored in the Cadd 43 for one frame period, a current from the current supply line 46 continues to flow in the EL device portion 45 during this period. Thus, light emission can be maintained for one frame period.

Figure 3:
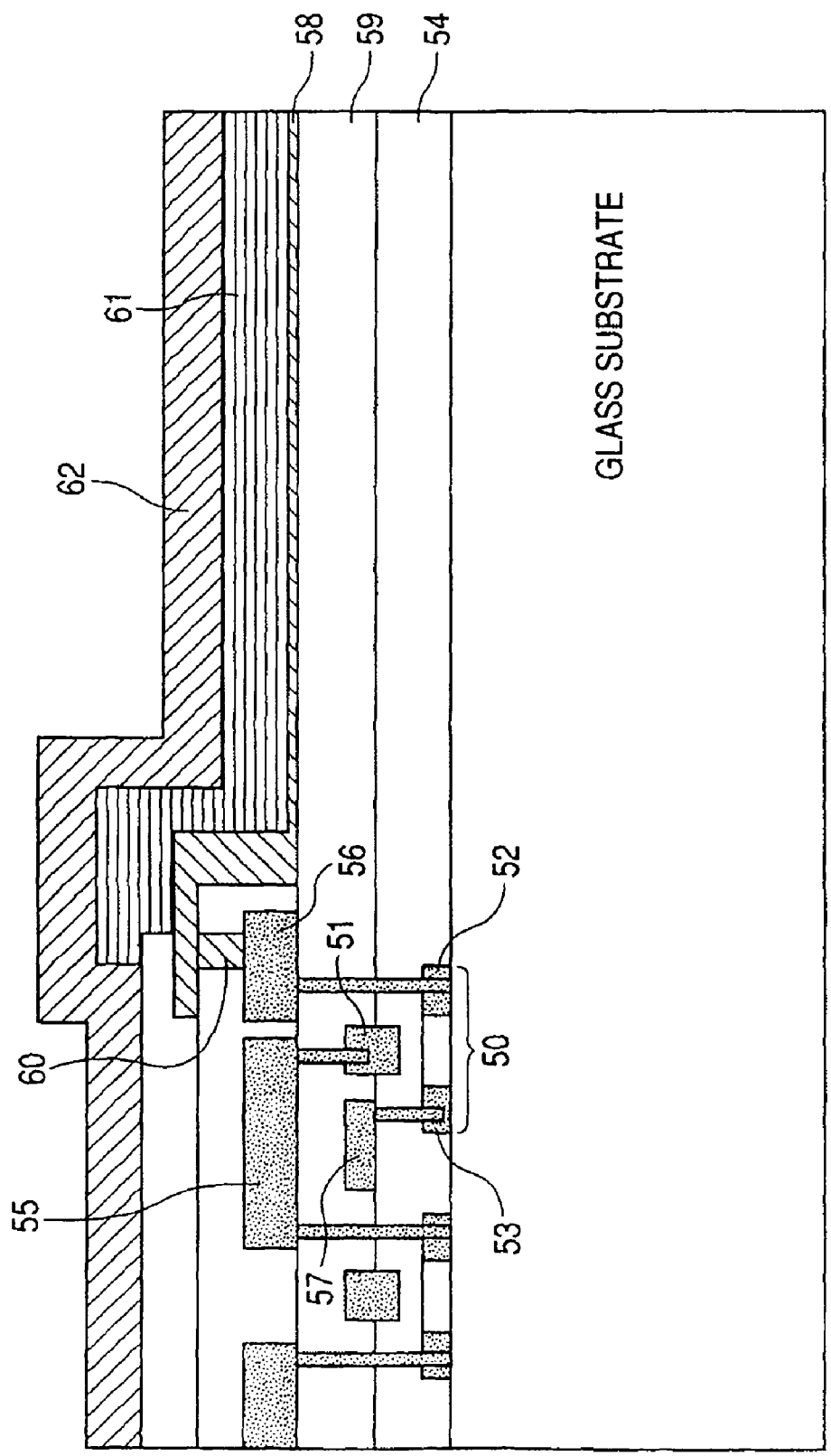
FIG. 3 is a schematic view showing the sectional structure of a TFT used in the present example.

FIG. 3 is a schematic view showing the sectional structure of a TFT used in the present example. A polysilicon p-Si layer 50 is arranged on a glass substrate. Impurities necessary for a channel region 51, a drain region 52, and a source region 53 are selected, and these regions are doped with the impurities. A gate electrode 55 is arranged thereon through a gate insulating film 54. In addition, a drain electrode 56 and a source electrode 57 to be connected to the drain region 52 and the source region 53 described above, respectively, are formed. At this time, the drain electrode 56 and a pixel electrode 58 are connected to each other through a contact hole 60 opened into insulating film 59 interposed therebetween.

Single or a plurality of organic light emission layers 61 are formed on the pixel electrode 58, and a common electrode 62 is sequentially stacked, so that an active-type organic light-emitting display device can be obtained. In an example of the present invention, Cr is subjected to patterning to use the pixel electrode 58 as an anode, and ITO is used as the common electrode (cathode) 62 so that light is taken from the side of ITO.

EXAMPLE 1

A substrate equipped with an active device having the same constitution as that described above and an anode was prepared. The pixels of a Cr anode were formed in such a manner that each pixel had a size of 60 μm×90 μm and a distance between two adjacent pixels was 40 μm. Thus, a display apparatus of 100×100 dots was produced. A display apparatus having the following pixels A and B different from each other in dependency of a view angle on the electrode was produced. At first, an organic EL layer was formed by means of a vacuum deposition method at a degree of vacuum of $8.0 \times 10^{-5}$ Pa. The chemical structure of each material shows below, and the conditions of depositing each layer are shown in Table 1 below.

TABLE 1

| Each layer | Material | Pixel A Thickness (nm) | Pixel B Thickness (nm) |
|---|---|---|---|
| Cathode | ITO | 70 | 100 |
| Electron injection layer | Bphen + Cs$_2$CO$_3$ | 40 | 40 |
| Electron transport layer | Bphen | 10 | 10 |
| Light emission layer | Alq3 + Coumarin6 | 30 | 30 |
| Hole transport layer | FL03 | 50 | 50 |
| Anode | Cr | 100 | 100 |

FL03: Film formation was performed at a deposition rate of 0.3 nm/sec.

Alq3+Coumarin 6: Co-deposition was performed with its rate adjusted in such a manner that the doping concentration of Coumarin 6 was 1 vol. % with respect to the deposition rate of Alq3 of 0.3 nm/sec.

Bphen: Film formation was performed at a deposition rate of 0.3 nm/sec.

Bphen+CS$_2$CO$_3$: Co-deposition was performed with its rate adjusted in such a manner that the doping concentration of Cs$_2$CO$_3$ was 0.65 vol. % with respect to the deposition rate of Bphen of 0.3 nm/sec. Cs$_2$CO$_3$ (cesium carbonate) was used here for promoting the injection of an electron from ITO.

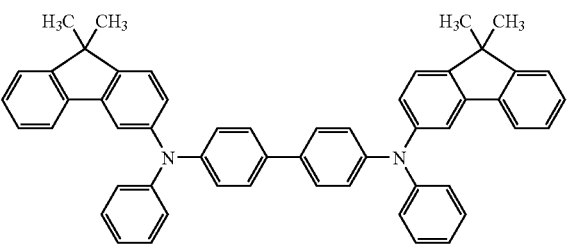

FL03

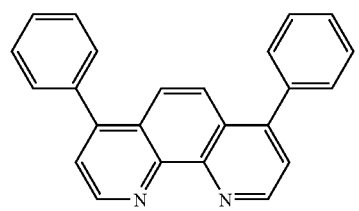

Bphen

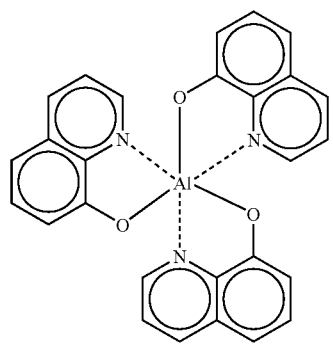

Alq3

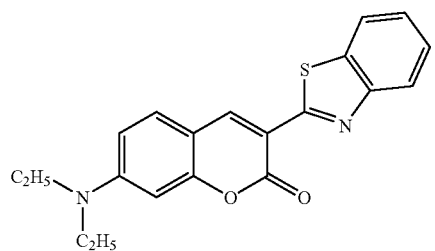

Coumarin6

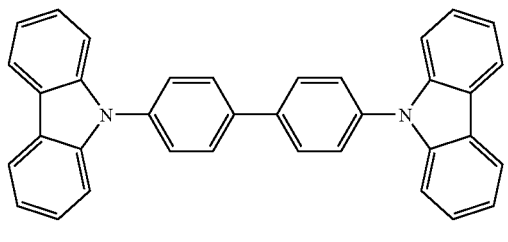

CBP

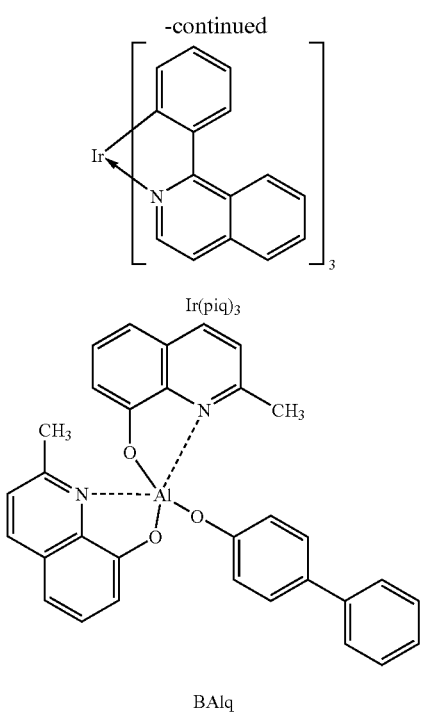

Ir(piq)₃

BAlq

Figure 4:
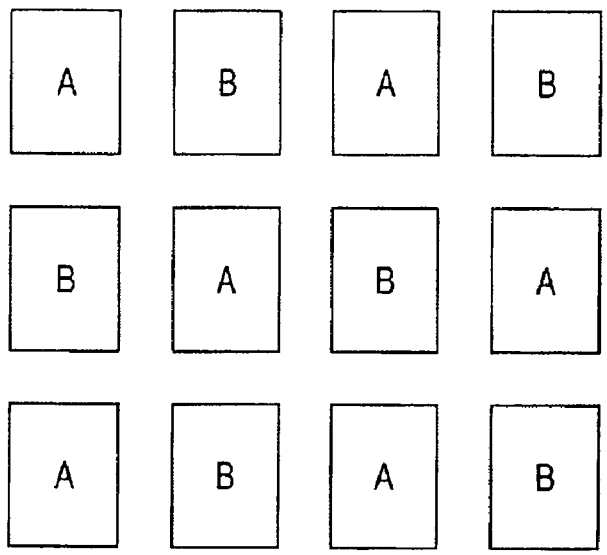
FIG. 4 is an explanatory view showing the arrangement of pixels of Example 1.

After the organic layer had been deposited from the vapor, the substrate was transferred to a chamber for sputtering while the degree of vacuum was maintained. ITO as a cathode having the above thickness was formed by means of a sputtering method at a film forming rate of 0.35 nm/sec. At that time, the thickness was adjusted for each pixel by means of a shadow mask. The pixels A and B were arranged at a ratio set to 50:50 as shown in FIG. 4 in such a manner that neither unevenness nor moire would occur.

Figure 5:
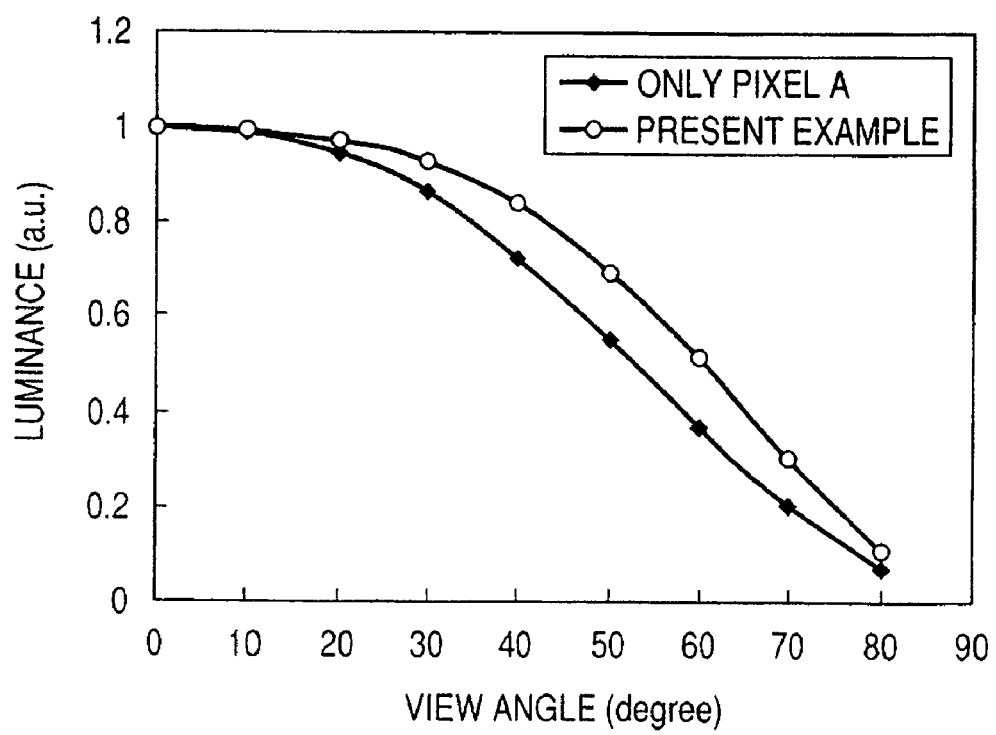
FIG. 5 is an explanatory diagram showing the dependency of luminance on a view angle of Example 1.

A driver circuit programmed to have one frame of 16.7 msec was connected to the produced display apparatus, and green light emission was observed. FIG. 5 shows data obtained by measuring the dependency of the luminance of the display apparatus on a view angle.

The dependency of a display apparatus on a view angle constituted by only the pixel A was shown in FIG. 5 for comparison. The luminance on the front face (at a view angle of 0°) of the display apparatus of the present example reduced by about 14% as compared to that of the display apparatus constituted by only the pixel A. However, the display apparatus of the present example reduced the dependency of the luminance on the view angle while holding sufficient brightness.

EXAMPLE 2

In Example 2, red (R), green (G), and blue (B) light-emitting pixel units were produced on a substrate equipped with an active device having the same constitution as that described above and an anode, so a full-color light-emitting display apparatus was produced. A mode in which pixels were divided was adopted, and each of pixel units was composed of R, G, and B light-emitting pixels each constituted by two areas different from each other in dependency of a view angle. A pixel of a Cr anode was constituted by two areas each having a size of 30 μm×60 μm, and an interval for dividing the areas was 20 μm. In addition, a distance between two adjacent pixels was 40 μm, and a delta-type was adopted for the arrangement of R, G and B light-emitting pixel groups. Thus, a display apparatus of 72×90 dots was produced. A red light-emitting pixel having areas $R_A$ and $R_B$ different from each other in dependency of a view angle, a green light-emitting pixel having areas $G_A$ and $G_B$ different from each other in dependency of a view angle, and a blue light-emitting pixel having areas $B_A$ and $B_B$ different from each other in dependency of a view angle described below were produced on the electrode. At first, an organic EL layer was formed by means of a vacuum deposition method at a degree of vacuum of $8.0 \times 10^{-5}$ Pa. The chemical structure of each material is shown above, and the conditions of depositing each layer are shown in Tables 2 to 4 below.

TABLE 2

| Each layer | Material | $R_A$ Thickness (nm) | $R_B$ Thickness (nm) |
|---|---|---|---|
| Cathode | ITO | 60 | 60 |
| Electron injection layer | Bphen + Cs₂CO₃ | 40 | 40 |
| Electron transport layer | Bphen | 10 | 10 |
| Light emission layer | CBP + Ir(piq)₃ | 40 | 40 |
| Hole transport layer | FL03 | 70 | 100 |
| Anode | Cr | 100 | 100 |

TABLE 3

| Each layer | Material | $G_A$ Thickness (nm) | $G_B$ Thickness (nm) |
|---|---|---|---|
| Cathode | ITO | 60 | 60 |
| Electron injection layer | Bphen + Cs₂CO₃ | 40 | 40 |
| Electron transport layer | Bphen | 10 | 10 |
| Light emission layer | Alq3 + Coumarin6 | 30 | 30 |
| Hole transport layer | FL03 | 60 | 80 |
| Anode | Cr | 100 | 100 |

TABLE 4

| Each layer | Material | $B_A$ Thickness (nm) | $B_B$ Thickness (nm) |
|---|---|---|---|
| Cathode | ITO | 60 | 60 |
| Electron injection layer | Bphen + Cs₂CO₃ | 40 | 40 |
| Electron transport layer | Bphen | 10 | 10 |
| Light emission layer | BAlq | 30 | 30 |
| Hole transport layer | FL03 | 50 | 70 |
| Anode | Cr | 100 | 100 |

FL03: Film formation was performed at a deposition rate of 0.3 nm/sec. In addition, a thickness was adjusted for each area by means of a shadow mask.

Alq3+Coumarin 6: Co-deposition was performed with its rate adjusted in such a manner that the doping concentration of Coumarin 6 was 1 vol. % with respect to the deposition rate of Alq3 of 0.3 nm/sec.

CBP+Ir(piq)$_3$: Co-deposition was performed with its rate adjusted in such a manner that the doping concentration of Ir(piq)$_3$ was 12 vol. % with respect to the deposition rate of CBP of 0.1 nm/sec.

Balq: Film formation was performed at a deposition rate of 0.3 nm/sec.

Bphen: Film formation was performed at a deposition rate of 0.3 nm/sec.

Bphen+Cs$_2$CO$_3$: Co-deposition was performed with its rate adjusted in such a manner that the doping concentration of Cs$_2$CO$_3$ was 0.65 vol. % with respect to the deposition rate of Bphen of 0.3 nm/sec. Cs$_2$CO$_3$ (cesium carbonate) was used here for promoting the injection of an electron from ITO.

Figure 6:
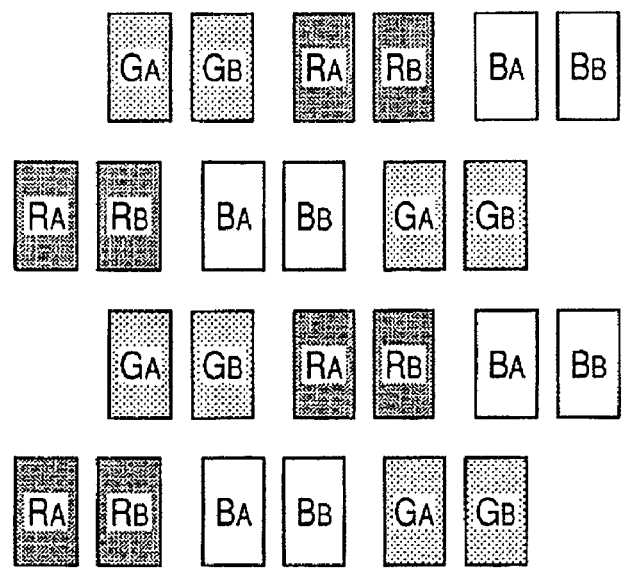
FIG. 6 is an explanatory view showing the arrangement of pixels of Example 2.
Figure 7:
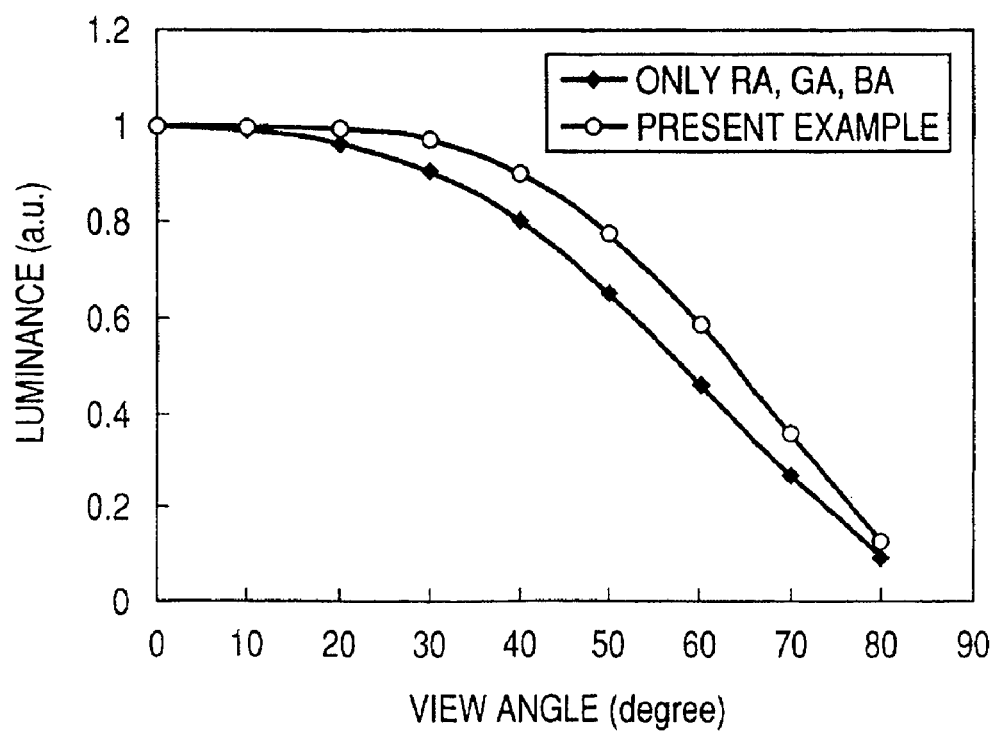
FIG. 7 is an explanatory diagram showing the dependency of luminance on a view angle of Example 2.
Figure 8:
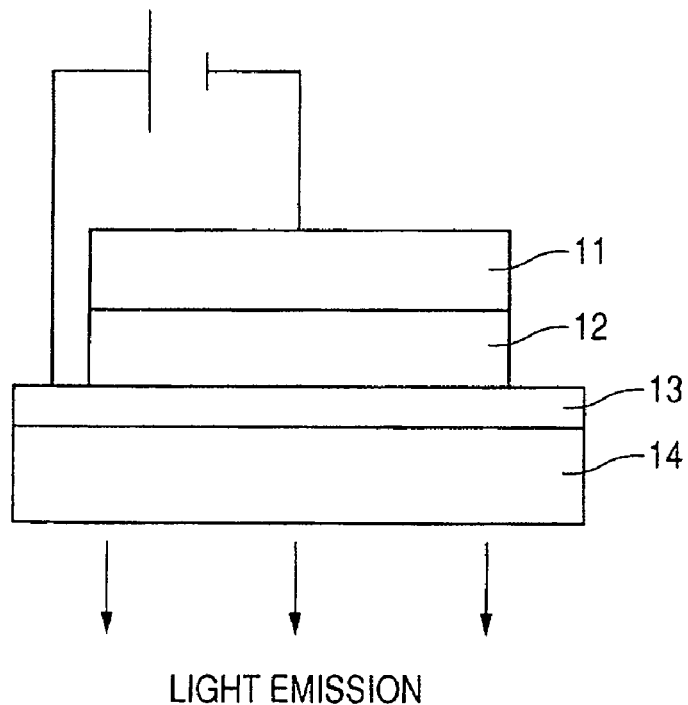
FIG. 8 is a schematic diagram showing an example of the general constitution of an organic EL device.
Figure 9:
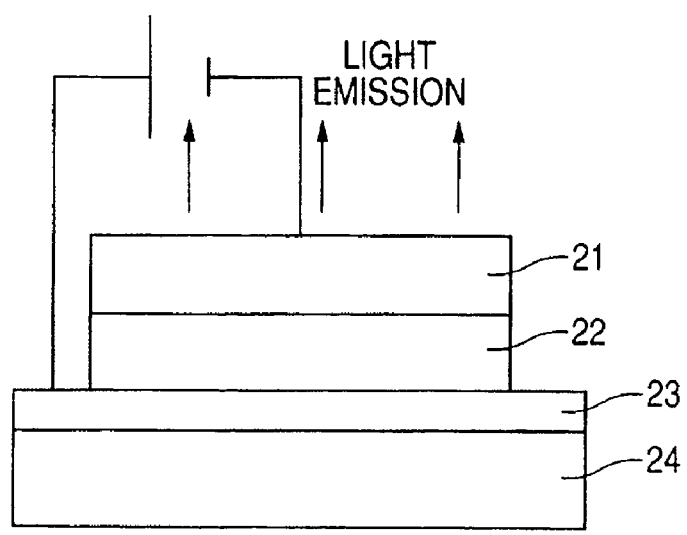
FIG. 9 is a schematic diagram showing another example of the general constitution of the organic EL device.

After the organic layer had been deposited from the vapor, the substrate was transferred to a chamber for sputtering while the degree of vacuum was maintained. ITO as a cathode having the above thickness was formed by means of a sputtering method at a film forming rate of 0.35 nm/sec. At that time, the pixel arrangement was set as shown in FIG. 6 in such a manner that neither unevenness nor moire would occur. A driver circuit programmed to have one frame of 16.7 msec was connected to the produced display apparatus, and white light emission was observed on condition that the current of each color-light-emitting pixel was adjusted. FIG. 7 shows data obtained by measuring the dependency of the luminance of the display apparatus on a view angle. The dependency of a display apparatus on a view angle constituted by only the R$_4$, G$_4$, and B$_4$ was shown in FIG. 7 for comparison. The luminance on the front face (at a view angle of 0°) of the display apparatus of the present example reduced by about 18% as compared to that of the comparative example. However, the display apparatus of the present example reduced the dependence of the luminance on the view angle while holding sufficient brightness.

This application claims priorities from Japanese Patent Application Nos. 2005-083601 filed on Mar. 23, 2005 and 2006-068995 filed on Mar. 14, 2006, which are hereby incorporated by reference herein.

What is claimed is:

1. A display apparatus comprising a plurality of pixels each composed of an organic electroluminescent device, wherein one of the pixels is divided into a first area and a second area wherein in the first area luminance is higher than in the second area at a view angle of 0° and luminance is reduced with an increase in the view angle and wherein in the second area luminance is higher when the view angle is a first angle in the range of greater than −90° and smaller than 0° and when the view angle is a second angle in the range of greater than 0° and smaller than 90° and luminance is reduced as the view angle is deviated from the first angle and the second angle;

wherein luminescent color from a light emission layer in the first area and luminescent color from a light emission layer in the second area are the same color; and luminescent color at the view angle of 0°, luminescent color at the first angle and luminescent color at the second angle are the same color.

2. A display apparatus according to claim 1, wherein the pixels emit lights of different colors.

3. A display apparatus according to claim 1, wherein the pixels are composed of a pixel emitting a red light, a pixel emitting a green light, and a pixel emitting a blue light, and the pixels forms a plurality of pixel units each composed of the pixel emitting a red light, the pixel emitting a green light, and the pixel emitting a blue light.

4. A display apparatus according to claim 1, wherein the organic electroluminescent device has a pair of electrodes and at least one organic compound layer interposed between the pair of electrodes, and at least one electrode of the pair of electrodes has a different thickness.

5. A display apparatus according to claim 1, wherein the organic electroluminescent device has a pair of electrodes and at least one organic compound layer interposed between the pair of electrodes, and the at least one organic compound layer has a different thickness.

6. A display apparatus comprising a plurality of pixels each composed of an organic electroluminescent device, wherein the display apparatus has a first pixel and a second pixel which are divided for one kind of luminescent color, wherein the first pixel has a luminance higher than the second pixel at a view angle of 0° and the luminance is reduced with the increase in the view angle and wherein the second pixel has a luminance higher than the first pixel when the view angle is a first angle in the range of greater than −90° and smaller than 0° and when the view angle is a second angle in the range of greater than 0° and smaller than 90° and luminance is reduced as the view angle is deviated from the first angle and the second angle;

wherein luminescent color at the view angle of 0°, luminescent color at the first angle and luminescent color at the second angle are the same color.

7. A display apparatus according to claim 6, wherein the pixels are composed of a pixel emitting a red light, a pixel emitting a green light, and a pixel emitting a blue light, and the pixels forms a plurality of pixel units each composed of the pixel emitting a red light, the pixel emitting a green light, and the pixel emitting a blue light.

8. A display apparatus according to claim 6, wherein the organic electroluminescent device has a pair of electrodes and at least one organic compound layer interposed between the pair of electrodes, and at least one electrode of the pair of electrodes in each of the pixels has a different thickness.

9. A display apparatus according to claim 6, wherein the organic electroluminescent device has a pair of electrodes and at least one organic compound layer interposed between the pair of electrodes, and the at least one organic compound layer in each of the pixels has a different thickness.

10. A display apparatus according to claim 1, wherein the first area and the second area have a different light-emitting area.

11. A display apparatus according to claim 6, wherein the first pixel and the second pixel have a different light-emitting area.

* * * * *